(12) United States Patent
Watanabe et al.

(10) Patent No.: US 9,060,440 B2
(45) Date of Patent: Jun. 16, 2015

(54) ELECTRONIC CONTROL APPARATUS

(71) Applicant: HITACHI AUTOMOTIVE SYSTEMS, LTD., Hitachinaka-shi, Ibaraki (JP)

(72) Inventors: Hirofumi Watanabe, Isesaki (JP);
Kazuhiko Nakano, Isesaki (JP);
Daisuke Yasukawa, Hitachinaka (JP)

(73) Assignee: HITACHI AUTOMOTIVE SYSTEMS, LTD., Hitachinaka-shi (JP)

( * ) Notice: Subject to any disclaimer, the term of this patent is extended or adjusted under 35 U.S.C. 154(b) by 131 days.

(21) Appl. No.: 13/852,607

(22) Filed: Mar. 28, 2013

(65) Prior Publication Data
US 2013/0286606 A1    Oct. 31, 2013

(30) Foreign Application Priority Data

Apr. 25, 2012   (JP) ................. 2012-099398

(51) Int. Cl.
*H05K 5/00* (2006.01)
*H05K 7/14* (2006.01)
*H02K 11/00* (2006.01)

(52) U.S. Cl.
CPC .......... *H05K 7/1417* (2013.01); *H02K 11/0068* (2013.01); *H02K 11/0073* (2013.01)

(58) Field of Classification Search
USPC ................. 361/728, 720, 752, 807, 809, 810;
174/138 E, 138 G
See application file for complete search history.

(56) References Cited

U.S. PATENT DOCUMENTS

| | | | | |
|---|---|---|---|---|
| 5,973,926 A * | 10/1999 | Sacherman et al. | ........... | 361/759 |
| 6,757,155 B2 * | 6/2004 | Koike et al. | ................. | 361/600 |
| 6,785,146 B2 * | 8/2004 | Koike et al. | ................. | 361/759 |
| 7,040,905 B1 * | 5/2006 | Wang | ........................... | 439/76.1 |
| 7,462,055 B2 * | 12/2008 | Kuo et al. | ...................... | 439/330 |
| 7,583,517 B2 * | 9/2009 | Hartman et al. | ............... | 361/810 |
| 8,213,186 B2 * | 7/2012 | Hsu | ................................ | 361/799 |
| 2013/0058044 A1 * | 3/2013 | Watanabe et al. | ............. | 361/714 |

FOREIGN PATENT DOCUMENTS

JP    2010-062220 A    3/2010

* cited by examiner

*Primary Examiner* — Hung S Bui
(74) *Attorney, Agent, or Firm* — Foley & Lardner LLP

(57) ABSTRACT

A supporting structure comprises a base member to support a printed circuit board, a holder standing upright from the base member and supporting the printed circuit board; and a support standing upright from the base member and supporting the printed circuit board sidewise. The support includes a column standing upright from the base member, and having a modulus of elasticity greater than that of the holder, and an abutment portion to abut on a side surface of the printed circuit board.

11 Claims, 6 Drawing Sheets

ELECTRONIC CONTROL APPARATUS

BACKGROUND OF THE INVENTION

The present invention relates to an electronic control apparatus provided with a printed circuit board or control board and/or a supporting structure of supporting a printed circuit board or control board.

A Japanese patent document JP 2010-62220A shows a supporting structure for a printed circuit board. A printed circuit board (70 as shown in FIG. 2 of this document) is held by a snap fit joint portion which projects downwards from a cover (5) and inserted in a hole of the printed circuit board.

SUMMARY OF THE INVENTION

However, the holding structure disclosed in the above-mentioned Japanese patent document is unable to sufficiently absorb vibrations in a lateral direction substantially parallel to the surfaces of the printed circuit board, transmitted to the printed circuit board from the base member supporting the printed circuit board through the snap fit joint portion. Therefore, undesirable stress is applied to connection terminals and solder portions of the printed circuit board by the lateral vibrations.

Therefore, it is an object of the present invention to provide an electronic control apparatus and/or a supporting structure supporting a circuit board designed to support the circuit board reliably even in a lateral direction extending along the surface of the circuit board, or to increase the rigidity in the lateral direction, without increasing the number of required parts.

According to one aspect of the present invention, an electronic control apparatus or a supporting structure thereof comprises a base member, a holder and a support. The base member is a member to support a printed circuit board. The holder stands upright from the base member and supports or holds the printed circuit board. The support stands upright from the base member and supports the printed circuit board sidewise. The support includes a column standing upright from the base member and having a modulus of elasticity greater than that of the holder, and an abutment portion to abut on a side surface of the printed circuit board.

DETAILED DESCRIPTION OF THE INVENTION

In an illustrated embodiment, an electronic control apparatus according to the present invention is applied to a brake booster for a motor vehicle.

In a brake system for a motor vehicle, a brake pedal is connected with a first piston provided in a first cylinder having a smaller cross sectional area, and the first cylinder filled with a hydraulic fluid or oil is connected with a second cylinder having a greater cross sectional area. A second piston provided in the second cylinder is connected with a brake booster. The second cylinder is connected with a wheel brake actuator of each wheel of the vehicle, through an ABS device (anti-lock-brake-system) for preventing tire lock, and/or a VDC device (vehicle dynamics control) for controlling the attitude of the vehicle in case of side slip etc., in this example.

The hydraulic pressure produced by the depressing force of the brake pedal is increased by the two cylinders, and further increased by the brake booster. The brake booster may have a construction to increase the hydraulic pressure by utilizing exhaust pressure of an engine or a construction to increase the hydraulic pressure with an electric actuator.

In this embodiment, the electronic control apparatus is applied to the brake booster arranged to increase the hydraulic pressure with an electric actuator.

Figure 1:
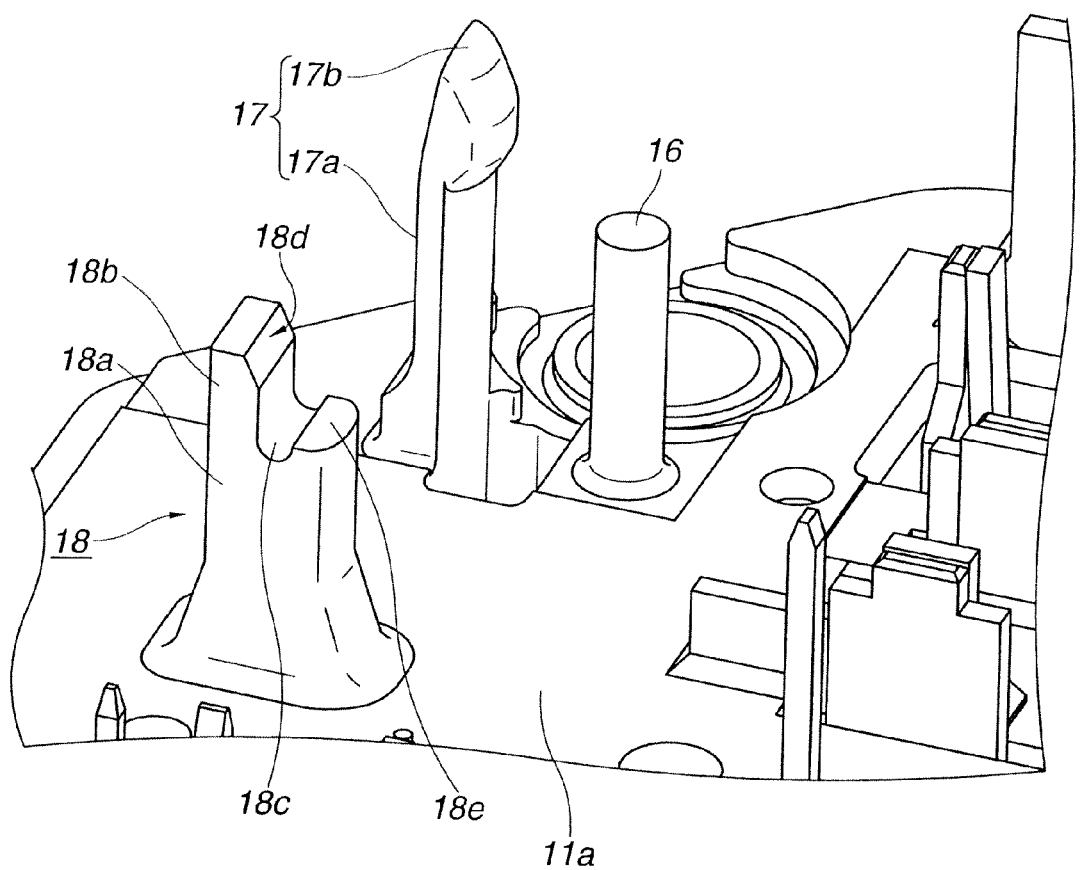
FIG. 1 is a perspective view showing a main portion of an electronic control apparatus according to one embodiment of the present invention.
Figure 2:
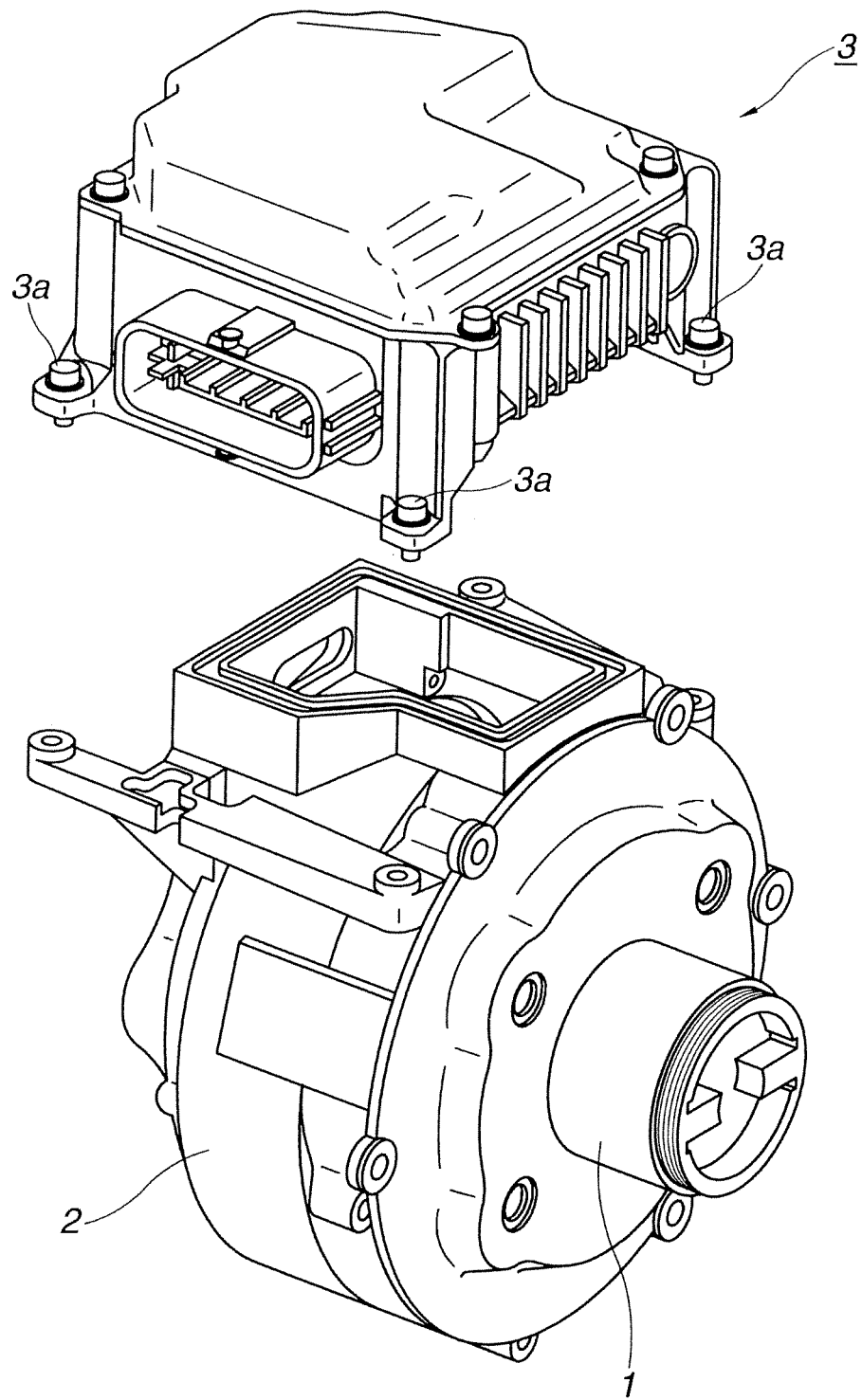
FIG. 2 is a perspective view showing a construction of a brake booster according to the embodiment.

FIG. 2 shows the brake booster in an outside view. A cylinder 1 shown in FIG. 1 corresponds to the above-mentioned second cylinder. The oil pressure in this cylinder 1 is increased by the brake booster shown in FIG. 2. The brake booster is arranged to sense the oil pressure increased by depression of the brake pedal, and assist the brake operation by increasing the oil pressure. The thus-boosted oil pressure is supplied directly or through the ABS device and/or VDC device, to the wheel brake actuator of each wheel of the vehicle.

The brake booster includes an electric motor 2 for increasing the oil pressure for assistance, and an electronic control unit (ECU) 3 serving as controlling means for controlling electric motor 2. ECU 3 is joined to an upper part of a casing of electric motor 2, with a plurality of fastenings devices 3a which are four bolts in this example.

Figure 3:
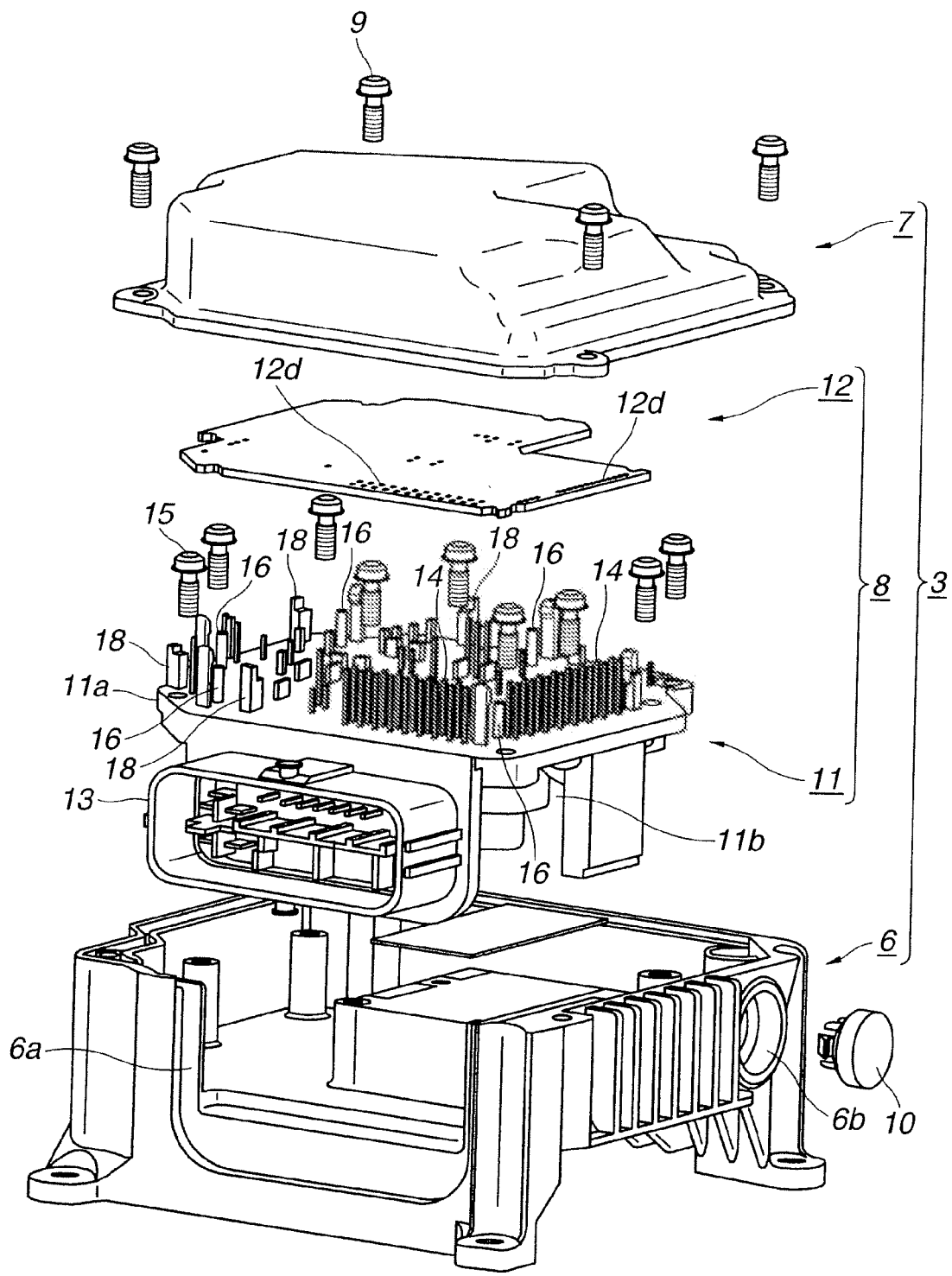
FIG. 3 is an exploded perspective view of the brake booster according to the embodiment.

As shown in FIG. 3, ECU 3 includes a circuit section 8 received in a chamber between a housing 6 and a cover 7. Housing 6 is approximately in the form of a rectangular box having a bottom. Cover 7 is mounted on housing 6 to cover an upper opening of housing 6 though a seal member (not shown) and joined to housing 6 by a plurality of fastening devices 9 which are four screw fasteners in this example. Housing 6 includes a rectangular opening 6a and a circular opening 6b formed in sides of housing 6. The circular opening 6b is equipped with a filter 10 such as a breather filter.

The circuit section 8 includes a power board (not shown) for supplying power to electric motor 2, a filter assembly 11 including a filter electronic circuit for removing electrical noise, and a printed circuit board or printed wiring board 12 forming a control board to control electric motor 2.

The assembly 11 is a molding formed, as an integral single unit, by the injection molding. Assembly 11 include a female connector 13 formed integrally in assembly 11 and fit in the opening 6a of housing 6. Female connector 13 is adapted to be connected with a battery power source. Assembly 11 includes a base board (or board main member) 11a and a plurality of busbars 14 (or connection terminals) and a receiving portion 11b. The base board or support board 11a is a plate-shaped member or portion made of a synthetic resin. The busbars 14 are metallic conductors standing upright from an upper surface of base board 11a. The receiving portion 11b is a hollow portion formed under a lower surface of base board 11a, and adapted to receive electronic components forming filter assembly 11 such as a relay circuit, a common mold coil, a normal mold coil and a capacitor or condenser.

The assembly 11 is fixed in housing 6, by a plurality of fastening devices 15 such as screw fasteners.

The printed circuit board 12 is supported above the assembly 11. Printed circuit board 12 is provided with a control circuit including a computer. The control circuit delivers a control signal to control the drive of an inverter (semiconductor device) of a driver circuit of the electric motor 2. Printed circuit board 12 is formed with a plurality of through holes 12d. The above-mentioned busbars or connection terminals 14 are inserted through these through holes 12d, and connected by soldering.

The printed circuit board 12 is supported on the base board (or support board) 11a serving as a base member, by a holding mechanism for holding or supporting the printed circuit board 12 above the base board 11a, as explained below.

At least one support member or support portion 18 (serving as a support, or as at least part of supporting means) stands upright (in a vertical direction or first direction) from (the upper surface of) the base board 11a and arranged to support the printed circuit board 12 from a lateral direction (or second direction) extending along printed circuit board (so that the lateral direction is a direction substantially parallel to printed circuit board 12 or substantially parallel to lower and upper flat surfaces of printed circuit board 12). Support member 18 is formed integrally with base board 11a by resin molding. Therefore, support member 18 is an integral part of a resin molding including the base board 11a and support member 18.

Support member 18 (serving as a support) includes a column 18a, a seat portion (or ledge portion) 18e, an abutment portion (or side regulating portion) 18b and a groove 18c. The column 18a (serving as a post portion or column portion) stands upright (in the vertical direction) from (the upper surface of) base board 11a. The seat portion 18e, abutment portion 18b and groove 18c are formed in a projecting or upper end portion of column 18a. Seat portion 18e is arranged to support (the lower surface of) printed circuit board 12 seated on seat portion 18e. Abutment portion 18b projects upwards (in the vertical direction) beyond seat portion 18e. Abutment portion 18b is arranged to support an edge of printed circuit board 12 by abutting on the edge of printed circuit board 12, from the lateral direction. Groove 18c is formed between seat portion 18e and abutment portion 18b. Abutment portion 18b is formed with a guide surface 18d for guiding printed circuit board 12 onto seat portion 18e in an operating of placing printed circuit board 12 on seat portion 18e.

Figure 5:
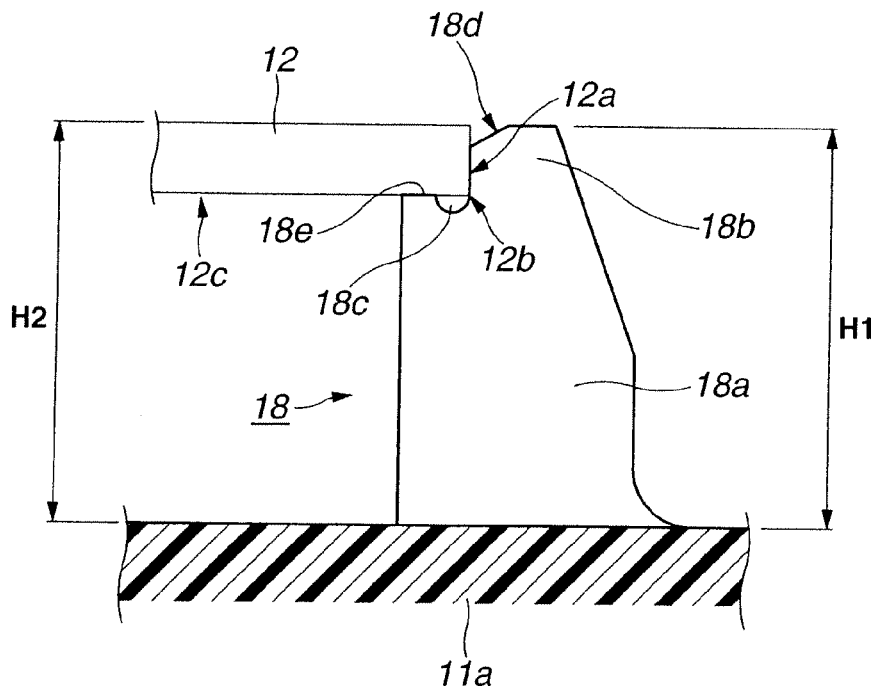
FIG. 5. is a view showing a support member shown in FIG. 1, supporting a printed circuit board.

As shown in FIG. 5, the abutment portion 18b is arranged to support or abut on a side surface 12a of printed circuit board 12, and thereby to prevent or restrain the printed circuit board 12 from being shifted sidewise in the lateral direction toward the outer circumference of the base board 11a and toward the side surface 12a of printed circuit board 12, due to vibrations of the base board 11a and printed circuit board 12. Printed circuit board 12 is supported so as to be held parallel to base board 11a. Therefore, the abutment portion 18b is arranged to prevent parallel displacement between the printed circuit board and base board 11a. Abutment portion 18b includes an abutment (flat) surface facing in the lateral direction toward the edge of printed circuit board 12 and abutting on the side surface 12a of printed circuit board 12.

The seat portion 18e of support member 18 is arranged to support a first surface (or confronting surface or lower surface) 12c of printed circuit board 12 confronting base board 11a, as shown in FIG. 5. Seat portion 18e includes a seat (flat) surface abutting on the first surface 12c of printed circuit board 12.

The groove 18c is formed between abutment portion 18b and seat portion 18e in order to improve the ability of supporting printed circuit board 12 with abutment portion 18b and seat portion 18e.

In the process of molding the support member 18, the boundary between abutment portion 18b and seat portion 18e might be formed in the shape of curved surface. When an angled corner 12b of printed circuit board 12 is in contact with the curved boundary, the contact between the side surface 12a of printed circuit board 12 and the abutment surface of abutment portion 18b might become poor, and there might be formed a clearance, so that the performance of supporting the side of printed circuit board 12 might be degraded. Furthermore, the contact between the confronting surface 12c of printed circuit board 12 and the seat surface of seat portion 18e might become poor and there might be formed a clearance, so that the performance of supporting the confronting lower surface of printed circuit board 12 might be degraded. Therefore, the groove 18c is formed between the abutment surface of abutment portion 18b and the seat surface of seat portion 18e, and designed to improve the contact between the abutment surface of abutment portion 18b and the side surface 12a of printed circuit board 12, and to improve the contact between the seat surface of seat portion 18e and the lower surface 12c of printed circuit board 12.

Thus, the groove 18c can prevent formation of curved or tapered portion between abutment portion 18b and seat portion 18e, allow escape of the contact of angled corner 12b, and ensure the surface contact between the abutment surface of abutment portion 18b and the side surface 12a of printed circuit board 12, and the surface contact between the seat surface of seat portion 18e and the lower surface 12c of printed circuit board 12.

Figure 4:
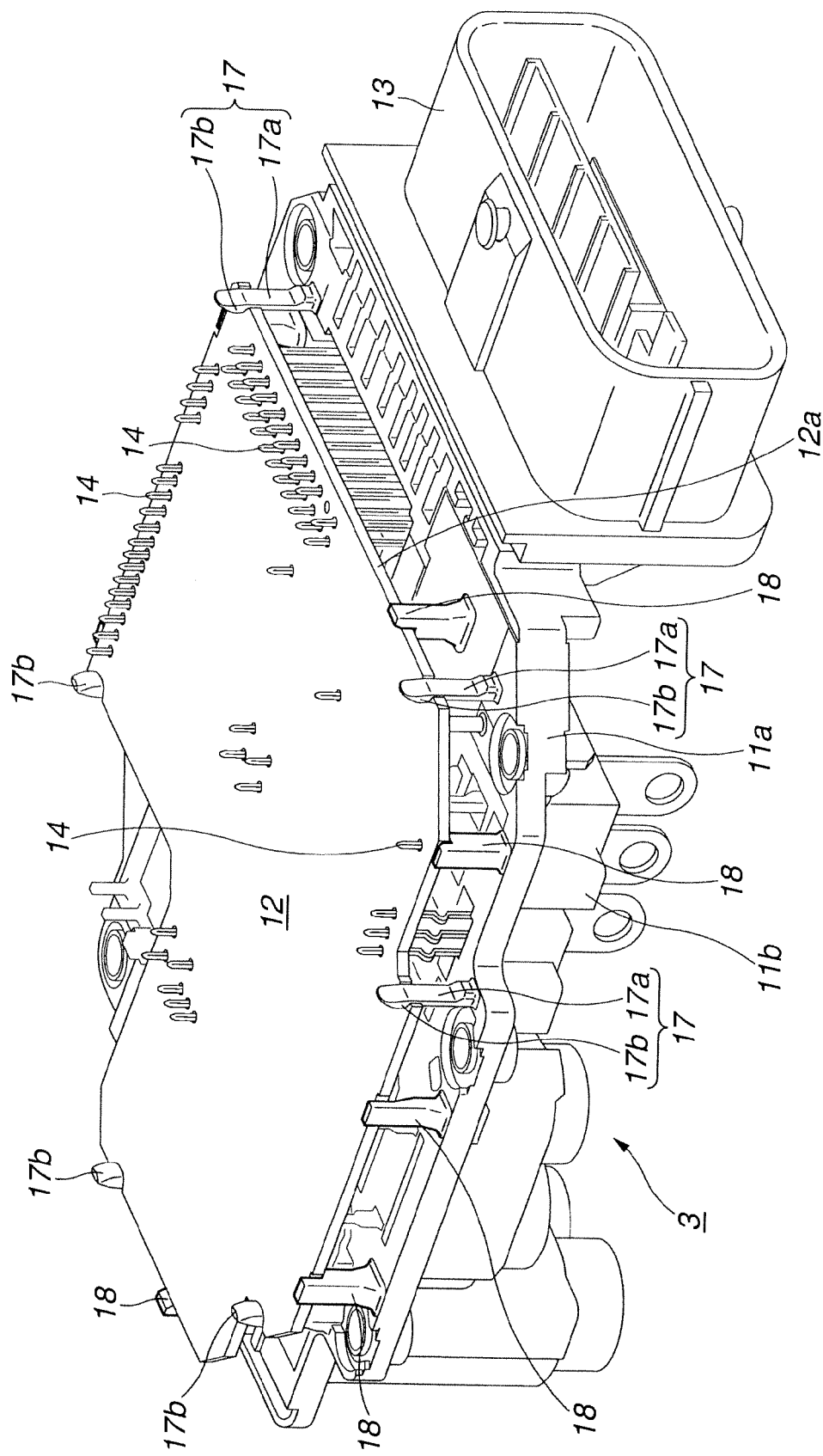
FIG. 4 is a perspective view of the electronic control apparatus according to the embodiment for the brake booster.

As shown in FIG. 4, there are provided a plurality of the support members or support portions 18 distributed around the printed circuit board 12 and arranged to support the outside circumference of printed circuit board 12 at a plurality of support points.

The support members 18 are so positioned as to support sides of printed circuit board 12 at a deviated position or deviated positions away from the middle of the supported side of printed circuit board 12 between both ends of the side. The thus-arranged support members 18 can prevent rotation of printed circuit board 12 about a vertical axis perpendicular to printed circuit board 12 or in the outside circumferential direction.

At least one of support members 18 is located near one or more busbars or connection terminals 14 which are inserted through printed circuit board 12 and connected with printed circuit board 12 by soldering. This support member 18 near the busbar 14 is formed as a non-projecting or shorter support member or portion. In the case of the non-projecting support member 18, as shown in FIG. 5, the abutment portion 18b does not project beyond printed circuit board 12. The top of abutment portion 18b is located at or below a level of the opposite (upper) surface of printed circuit board 12 opposite to the confronting (lower) surfaced 12c.

As shown in FIG. 5, the height H1 of non-projecting support member 18 from the base board 11a is equal to or smaller than the height H2 of the upper surface of printed circuit board 12 from base board 11a. The abutment portion 18b supports the side surface 12a of printed circuit board 12 at the level equal to or lower than the height H2 of printed circuit board 12.

In the example of FIG. 4, the second support member 18 from the right on the near side is located near one of the busbars 14. Therefore, this support member 18 is formed so that the top surface of abutment portion 18b is located substantially at the same level as the upper surface of printed circuit board 12, as shown in FIG. 5.

At least one hold member or hold portion (or holder) 17 (snap fit) is provided in addition to the support members 18, in this embodiment. In the illustrated example, as shown in FIGS. 1, 3 and 4, the hold member 17 is in the form of a snap fit, and there are provided a plurality (six) of hold members (snap fits) 17. Each of hold members 17 stands upright from base board 11a and holds printed circuit board 12.

Each hold member (snap fit) 17 is formed integrally with base board 11a by the resin molding so that snap fit 17 is an integral part of the molding of base board 11a.

Each hold member 17 includes a column 17a standing upright from base board 11a toward printed circuit board 12, and a protruding ledge 17b formed in a projecting (upper) end portion of column 17a. The protruding ledge 17b protrudes toward printed circuit board 12 and having an arched protruding shape.

A seat column 16 is formed near each hold member 17. As shown in FIG. 1, the seat column 16 of this example is a cylindrical column stands in front of the adjacent support member 17 at a position spaced from the adjacent support member 17. The seat column 16 is located at a forward position in front of the adjacent support member so that the seat column 16 is located under printed circuit board 12. The seat column 16 has a top (flat) surface serving as a seat surface supporting the printed circuit board 12. 0204

The distance between the arched protruding ledge 17b of hold member 17 and the seat column 16 is equal to or smaller than the thickness of printed circuit board 12. Printed circuit board 12 is inserted and fit between the arched protruding ledge 17b and the seat column 16, and thereby held firmly between arched protruding ledge 17b and seat column 16. Thus, the printed circuit board 12 is supported in the vertical direction which is a direction substantially perpendicular to the upper and lower surfaces of printed circuit board 12, and fixed to base board 11a.

The column 17a of hold member (snap fit) 17 has elasticity or flexibility. In the operation of inserting the printed circuit board 12 between the arched protruding ledge 17b and seat column 16, the projecting (upper) end portion of column 17a is warped rearwards in the inserting direction of printed circuit board 12, so as to increase the spacing between the arched protruding ledge 17b and seat column 16 and thereby to facilitate the insertion of printed circuit board 12. After the insertion of printed circuit board 12, the column 17a having the elasticity returns to the original position and secures the force holding the printed circuit board 12 with reaction.

The confronting (lower) surface 12c of printed circuit board 12 facing toward base board 11a is preferably supported by both of the seat portions 18e of support members 18 and the seat columns 16. However, under the influence of nonuniformity in the heights of seat portions 18e and the seat columns 16, and a warping condition of printed circuit board 12, the confronting surface 12c of printed circuit board 12 is supported only by some of the seat portions 18e and seat column 16. In this case, too, the supporting structure according to this embodiment can support the printed circuit board 12 sufficiently, despite possible gap and slackness.

The modulus of elasticity of support members 18 is greater than that of hold members (snap fits) 17, in this example. Moreover, the thickness of support members 18 is greater than that of hold members 17. Therefore, the support members 18 can support printed circuit board 12 firmly so as to prevent lateral displacement of printed circuit board 12 in the lateral direction along the (upper and lower) surfaces of printed circuit board 12, even if the hold members (snap fits) 17 are not rigid enough to prevent the lateral displacement.

The guide surfaces 18d formed in support members 18 can served as a guide for the printed circuit board 12 at the time of placing the printed circuit board 12 on the seat portions 18e in the assembly process of attaching printed circuit board 12 to base board 11a.

The thus-constructed electronic control apparatus is operated as follows.

The abutment portion (side regulating portion) 18b of each support member 18 abuts against the side surface 12a of printed circuit board 12 and thereby serves as a lateral support of limiting the lateral displacement of printed circuit board 12 relative to base board 11a in the outward direction toward the outer circumference of base board 11a.

Each holding setup including one of the hold members 17 and the adjacent seat column 16 holds the printed circuit board 12 at or near the side surface 12a of printed circuit board 12.

Confronting surface 12c of printed circuit board 12 can be supported by the seat portion 18e of support members 18.

Each holding setup of one of the hold members (snap fits) 17 and the adjacent seat column 16 functions to clamp the printed circuit board 12 between the arched protruding ledge 17b and the top seat surface of seat column 16, and thereby functions to prevent vertical displacement of printed circuit board 12 in the vertical direction which is a direction substantially perpendicular to the base board 11a and the printed circuit 12 which is located just above base board 11a (so that the (flat) base board 11a and the (flat) printed circuit 12 are substantially parallel to each other in the illustrated example).

As to the lateral displacement or parallel displacement of printed circuit board 12 in the lateral direction along base board 11a, the hold members 17 may be insufficient to support the printed circuit board 12 firmly since the hold members 17 are relatively flexible. In this embodiment, the more rigid support members 18 are arranged to support the side surfaces of printed circuit board 12 with the abutment portions 18b. Therefore, this supporting structure can set the resonance point of printed circuit board 12 higher and support the printed circuit board 12 firmly to prevent displacement of printed circuit board 12 in the outward lateral direction toward the outer circumference of base board 11a due to vibrations caused by movement of the vehicle.

Therefore, this supporting structure can reduce stress caused by vibrations to solder bonding portions of printed circuit board 12, and thereby prevent degradation of the solder bonding portions.

This supporting structure is arranged to support the edges or side surfaces (12a) of printed circuit board 12. Therefore, it is possible to improve the flexibility or freedom of the layout of the circuit pattern in printed circuit board 12 by eliminating the need for forming holes in the printed circuit board 12 for supporting printed circuit board 12.

The groove 18c can improve the ability of supporting the printed circuit board 12 onto the abutment portion 18b or the seat portion 18e, and thereby improve the efficiency of restraining the displacement of printed circuit board 12 due to vibrations.

As to the support member or members 18 located in a region receiving influence of heat produced by soldering operation for printed circuit board 12, the abutment portion 18b is made shorter so as not to project upwards from the printed circuit board 12 as shown in FIG. 5 and the top end of abutment portion 18b is located at or below a level of the upper surface of printed circuit board 12.

Figure 6:
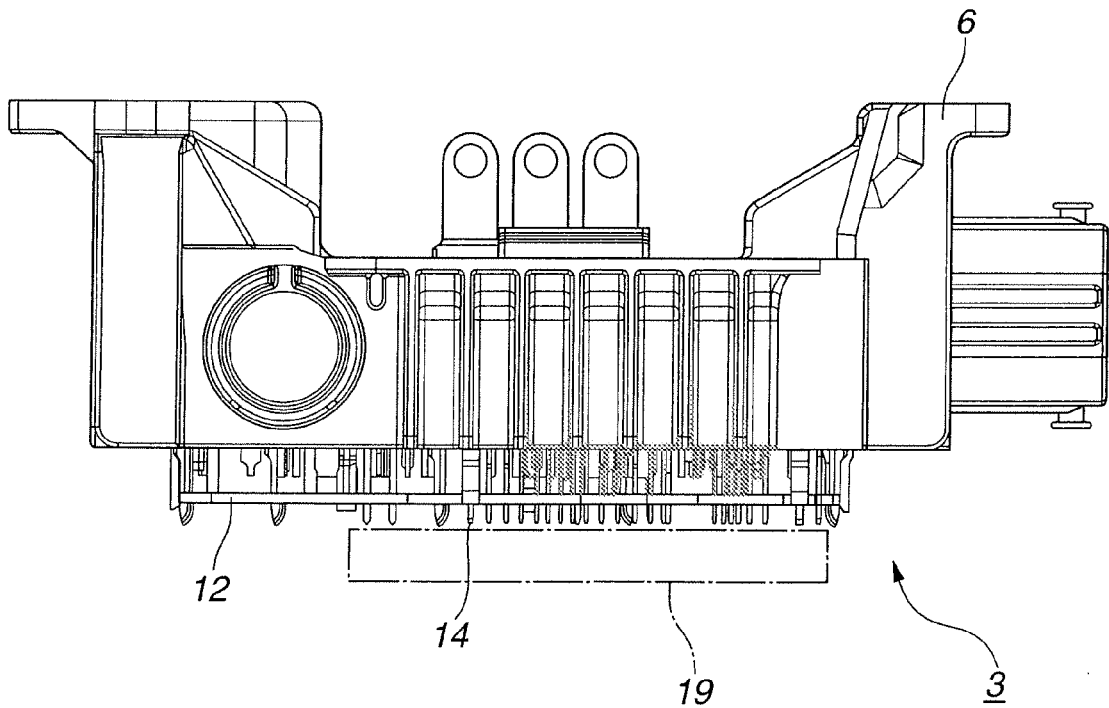
FIG. 6 is a view for illustrating a soldering operation of connecting busbars to the printed circuit board according to the embodiment.
Figure 7:
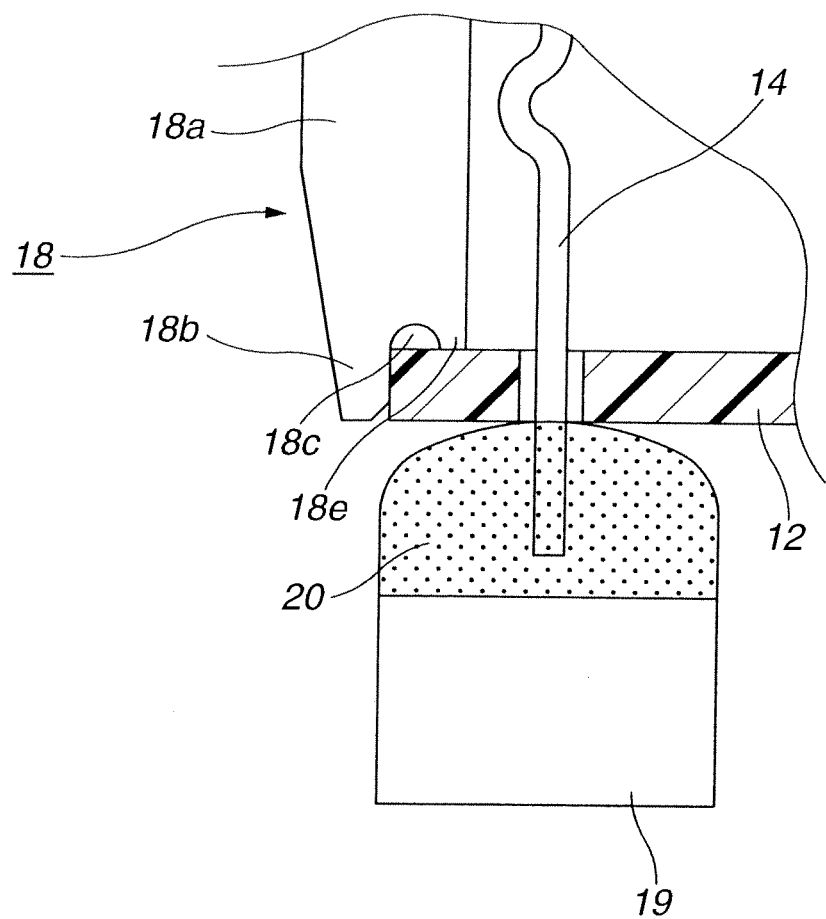
FIG. 7 is an enlarged view showing a main portion of FIG. 6.

Therefore, when the ECU 3 in the state shown in FIG. 4 before fixing the cover 7 is inverted, placed above a nozzle or nozzles 19 of a heating furnace, as shown in FIG. 6, and the connection terminals 14 are joined to printed circuit board 12 by soldering, this supporting structure can prevent contact of a molten solder 20 with the projecting end portion of abutment portion 18b of support member 18, and thereby prevent fusion or deformation of the projecting end portion of abutment portion 18b.

Support members 18 are located at support points at least one of which is spaced from the middle of adjacent side or edge of printed circuit board 12 toward one of both ends of the adjacent side or edge. Therefore, this supporting structure can prevent displacement of printed circuit board 12 in a rotational direction.

The supporting structure according to the embodiment may be arranged to support a plurality of sides or edges (12a) of printed circuit board 12 with the support members 18. Furthermore, at least one of the sides of printed circuit board 12 may be supported by a plurality of the support members 18.

The guide surface 18d formed in support member 18 can serve as a guide and thereby facilitate the assembly process of attaching the printed circuit board 12 to base board 11a.

The electronic control apparatus according to the embodiment shown in FIGS. 1, 3, 4, 5, 6 and 7 can be used as a brake booster (electronic control apparatus) which includes the electric motor 2 increasing the hydraulic pressure increased by operation of the brake pedal for assistance, as shown in FIG. 2, and the control device or means 3 which is connected with electric motor 2, which is configured to electric motor 2, and which includes a printed circuit board (12) supported on a base board (11a).

In this embodiment, the supporting structure can restrain lateral displacement of printed circuit board 12 in the lateral direction which is a direction extending along the surfaces of printed circuit board 12 caused by vibrations transmitted to printed circuit board from electric motor 2 through base board 11a, with support members 18.

In this brake booster, the supporting structure including support members 18 can restrain stress acting on the busbars 14 and other portions bonded to printed circuit board 12 by soldering, by restraining the lateral displacement of printed circuit board 12 relative to base board 11a.

In the illustrated example, there are provided the seat columns 16 to restrain (vertical) movement of printed circuit board 12 toward base board 11a. However, it is optional to omit the seat columns 16 and to support the printed circuit board 12 directly on the base board 11a. Moreover, it is optional to omit the seat portions 18e formed in support members 18, and instead to use the seat columns 16 for supporting the confronting (lower) surface of the printed circuit board 12. The number of the support members 18 is not limited to five. It is possible to choose the positions and number of the support members 18 appropriately.

According to one aspect of the present invention, a supporting structure for an electronic control apparatus comprises: a base member or base board to support a control board or a printed circuit board; at least one holder standing upright from the base member and supporting the control board or printed circuit board; and at least one support standing upright from the base member and supporting the control board or printed circuit board sidewise (in a lateral direction extending along the printed circuit board 12), the support including, a column standing upright from the base member, having a modulus of elasticity greater than that of the holder, and an abutment portion to abut on a side surface or an edge of the control board or printed circuit board. The electronic control apparatus according to the present invention may be a brake control apparatus including an electric actuator for increasing or boosting a hydraulic pressure increased by a pedal operation of a brake pedal, and a control device or means which is connected or joined with the electric actuator, which is configured to control the electric actuator and which includes the control board or printed circuit board supported on the base member or board.

This application is based on a prior Japanese Patent Application No. 2012-99398 filed on Apr. 25, 2012. The entire contents of this Japanese Patent Application are hereby incorporated by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. An electronic control apparatus comprising:
   a base member structured to support a printed circuit board;
   a holder standing upright from the base member and supporting the printed circuit board; and
   a support standing upright from the base member and supporting the printed circuit board in a lateral direction, the support including:
   a column standing upright from the base member, and having a modulus of elasticity greater than a modulus of elasticity of the holder, and
   an abutment portion structured to abut on a side surface of the printed circuit board.

2. The electronic control apparatus as recited in claim 1, wherein the abutment portion projects upright to a projecting end which does not project beyond the printed circuit board.

3. The electronic control apparatus as recited in claim 1, wherein the support is positioned so as to support an edge portion of the printed circuit board at a point away from a middle of the edge portion between ends of the edge portion.

4. The electronic control apparatus as recited in claim 1, wherein:
   the support is arranged to support the printed circuit board in the lateral direction in an area extending along a confronting surface of the printed circuit board confronting the base member, and
   the holder is arranged to support the printed circuit board in a vertical direction, which is a direction substantially perpendicular to the lateral direction.

5. The electronic control apparatus as recited in claim 4, wherein:
   the column of the support projects in the vertical direction from the base board toward the printed circuit board and includes a projecting end portion, the projecting end portion including the abutment portion and a seat portion structured to support the printed circuit board in the vertical direction;
   the seat portion includes a seat surface arranged to abut on the confronting surface of the printed circuit board; and
   the abutment portion projects in the vertical direction beyond the seat portion and includes an abutment surface arranged to abut on the side surface of the printed circuit board.

6. The electronic control apparatus as recited in claim 5, wherein the projecting end portion of the column of the support further includes a groove formed between the seat surface and the abutment surface.

7. The electronic control apparatus as recited in claim 6, wherein:
the projecting end portion of the column of the support includes an internal angled corner which is structured to receive an external angled corner of the printed circuit board, the internal angled corner being formed by the seat surface and the abutment surface; and
the groove is formed in the internal angled corner.

8. The electronic control apparatus as recited in claim 4, wherein the holder includes a snap fit joint portion structured to hold the printed circuit board.

9. The electronic control apparatus as recited in claim 4, further comprising a plurality of supports, including a first support and a second support, the first support including the abutment portion projecting beyond the printed circuit board, and the second support including the abutment portion which does not project beyond the printed circuit board.

10. The electronic control apparatus as recited in claim 1, wherein:
the base member includes a base board extending beneath the printed circuit board and having an upper surface confronting the printed circuit board;
the holder includes a column; and
the column of the holder and the column of the support stand upright from the upper surface of the base board of the base member toward the printed circuit board and support the printed circuit board.

11. The electronic control apparatus as recited in claim 10, further comprising:
a case enclosing the base member and the printed circuit board,
wherein the printed circuit board is supported inside the case via the base member, which is fixed to the case, and
wherein the column of the support and the column of the holder support the printed circuit board such that vibration is transmitted from the case to the printed circuit board only though the support and the holder.

* * * * *